United States Patent
Davison

(10) Patent No.: US 6,859,367 B2
(45) Date of Patent: Feb. 22, 2005

(54) HEAT SINK ATTACHMENT DEVICE

(75) Inventor: Peter A. Davison, Puyallup, WA (US)

(73) Assignee: Intel Corporation, Santa Clara, CA (US)

( * ) Notice: Subject to any disclaimer, the term of this patent is extended or adjusted under 35 U.S.C. 154(b) by 161 days.

(21) Appl. No.: 10/336,628

(22) Filed: Jan. 3, 2003

(65) Prior Publication Data

US 2004/0130876 A1 Jul. 8, 2004

(51) Int. Cl.[7] .............................................. H05K 7/20
(52) U.S. Cl. ...................... 361/704; 165/80.3; 165/185; 257/719; 257/726; 361/707; 361/710; 361/719; 361/720
(58) Field of Search ................................ 165/80.2–80.3, 165/185; 174/16.3; 257/706–707, 712–713, 718–719, 726–727; 361/704, 707, 710, 719–721, 715

(56) References Cited

U.S. PATENT DOCUMENTS

| 5,757,621 | A | * | 5/1998 | Patel ........................... 361/719 |
| 5,880,930 | A | * | 3/1999 | Wheaton ..................... 361/690 |
| 5,901,039 | A | * | 5/1999 | Dehaine et al. ............. 361/704 |
| 6,307,748 | B1 | * | 10/2001 | Lin et al. ..................... 361/704 |
| 6,404,632 | B1 | * | 6/2002 | Forkas ........................ 361/703 |
| 6,480,387 | B1 | * | 11/2002 | Lee et al. .................... 361/704 |
| 6,556,490 | B2 | * | 4/2003 | Shubat et al. ............... 365/200 |
| 6,680,848 | B2 | * | 1/2004 | Petit et al. .................. 361/704 |

* cited by examiner

*Primary Examiner*—Gregory D Thompson
(74) *Attorney, Agent, or Firm*—Schwabe, Williamson & Wyatt, P.C.

(57) ABSTRACT

Heat sink attachment components are provided comprising retention bolts with a coil spring captured between the head of the retention bolt and a retention lock flange of a retention lock. A portion of each retention bolt shaft is retained and in frictional engagement with socket bores of a mounting socket. A moderate interference fit between the retention lock and the retention bolt prevents unintended decoupling. While engaged, the compressed coil spring urges against the retention lock flange, with the retention lock flange in urging engagement with the heat dissipation side of a heat sink base, with the heat sink base in urging engagement with thermal interface material on the top of the microelectronic package. The urging engagement of the coil springs provide a constant bias for urging engagement between the components.

15 Claims, 4 Drawing Sheets

HEAT SINK ATTACHMENT DEVICE

FIELD OF THE INVENTION

The present invention relates to electronics assembly and, more particularly, to shock-resistant attachment devices.

BACKGROUND OF INVENTION

Many of today's electronic goods contain one or more electronic components that operate at elevated temperature requiring some type of thermal management system. By way of example, desktop or portable computers have one or more microelectronic packages that generate a considerable amount of thermal energy dissipated as heat. An example of a microelectronic package is an integrated circuit microprocessor, an example of which is a central processing unit (CPU) for the computer system.

In many cases, the heat can be managed with the attachment of a thermal conducting device having a large surface area to dissipate the heat into the environment. Such devices are known as heat sinks. Heat sinks are generally formed from a material having a high thermal conductivity comprising a broad base for coupling with the top of the microelectronic package and a series of fins or pins through which air may pass to dissipate the heat. In many cases, a fan is attached to the heat sink to provide forced convection for more efficient heat dissipation.

The attachment of a relatively massive heat sink, and possibly a heavy fan as well, to a microelectronic package involves a number of challenges. The microelectronic package is commonly coupled to a system substrate through an attachment structure, such as a pin grid array socket. A thermal conductive interface material, such as a soft foil, is placed between the top of the microelectronic package and the base of the heat sink to provide intimate thermal contact between the two. Plastic springs and metal side spring clips are some of the common devices used to hold the heat sink to the microelectronic package.

Computer systems are subjected to mechanical shock due to handling. A mechanical shock or impact to the computer system in a direction normal to the top of the microelectronic package, referred to as the "z" direction, can cause the heat sink to lift off of the top of the microelectronic package to be forced back into contact by the spring clamps. It is not uncommon that currently used attachment devices permit the heat sink to lift off of the microelectronic package by as much as 0.06 inch in response to an upward impact of 50 G acceleration used in testing such devices. This movement is not only a source of potential damage to the microelectronic package from the high dynamic forces due to the back-slap of the heat sink, the heat sink can become dislodged or thermally separated from the thermal interface material, drastically degrading thermal performance.

The heat sink attachment must also be able to compensate for different manufacturing tolerance accumulation from part to part. Contributors to tolerance issues include, but are not limited to, chassis standoff, system board, retention mechanism, socket, interposer, microelectronic package, thermal interface material, heat sink, solder reflow, and bolt length.

Further, some types of thermal interface materials experience a change in thickness over time. This dimensional change must be compensated for to ensure continuous intimate contact between the microelectronic package and the heat sink.

Improved heat sink attachment devices and methods are needed to prevent damage due to mechanical shock, to accommodate for manufacturing tolerances, as well as to accommodate for changes in dimensions over time. The attachment device should have the capability to be used for a number of heat sink/microelectronic package configurations to reduce inventory burdens and simplify assembly.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Figure 1:
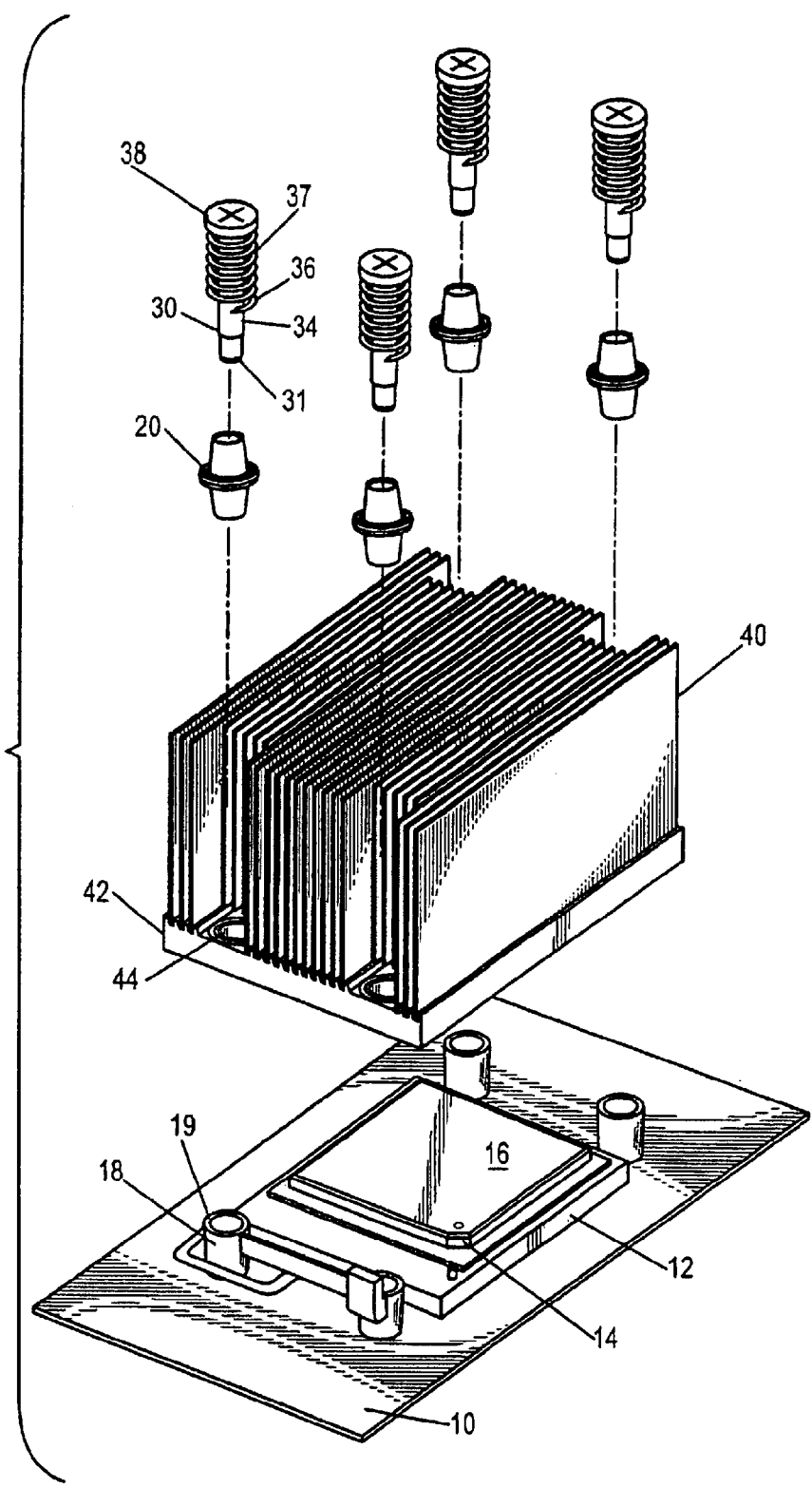
FIG. 1 is an exploded view of a heat sink attachment device in accordance with an embodiment of the present invention.

FIG. 1 is an exploded view of the heat sink attachment components in accordance with an embodiment of the present invention. A microelectronic package 14 is mounted onto a socket 12 attached to the system substrate 10 in a manner common to the art. The microelectronic package top 16 is provided with a thermal conductive interface material (not shown) also common to the art. The assembly also includes a retention mechanism frame 29 with sockets 18.

Retention bolts 30 comprise a shaft 34 and a head 38, which define a shoulder 37. Compression springs 36 are adapted to accept the shaft 34 and abut the shoulder 37 on the head 38.

The heat sink 40 comprises a base 42 provided with heat sink mounting bores 44. Retention locks 20 are provided.

Figure 2:
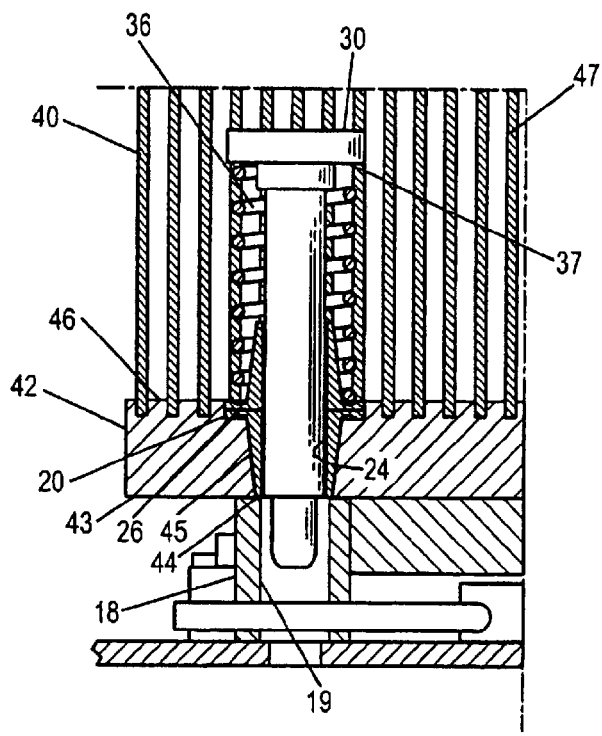
FIG. 2 is a cross-sectional view of the retention system prior to advancing the retention bolts into the socket bores, in accordance with an embodiment of the present invention.

FIG. 2 is a cross-sectional view of the retention system prior to advancing the retention bolts 30 into the socket bores 19 of the sink mounting sockets 18, in accordance with an embodiment of the present invention. Referring also to FIG. 1, the shaft 34 of each retention bolt 30 is advanced into a coil spring 36. The shaft 34 is advanced through a retention lock bore 24. The retention locks 20 are advanced into the tapered heat sink mounting bores 44 of the base 42 of the heat sink 40. The heat sink 40 is placed upon the sink mounting sockets 18, with the shafts 34 of the retention bolts 30 aligned with the retention with the retention mechanism frame 19.

Figure 3A:
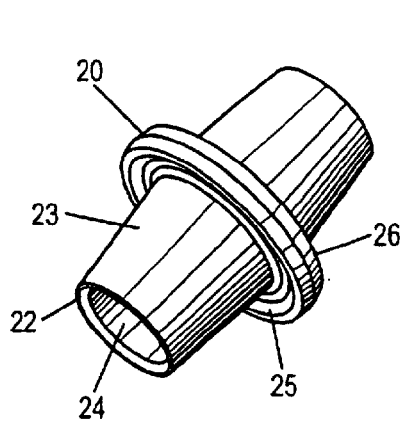
FIGS. 3A and 3B are perspective and cross-sectional views of a retention lock in accordance with an embodiment of the present invention.
Figure 3B:
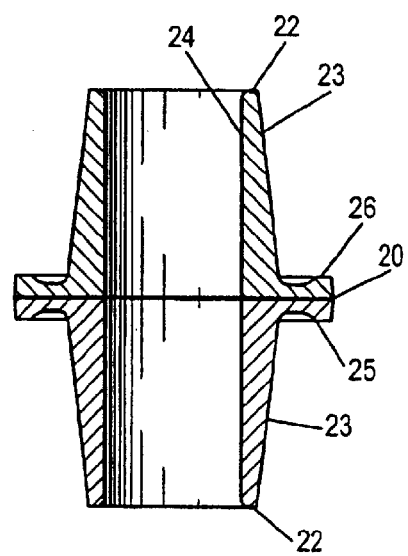

FIGS. 3A and 3B are perspective and cross-sectional views of a retention lock 20 in accordance with an embodiment of the present invention. The retention lock 20 comprises a retention lock bore 24 and two ends 22 in mirror image extending from a retention lock flange 26. The retention lock sides 23 of the retention lock ends 22 taper inward the further away from the retention lock flange 26. The retention lock bore 24 is adapted to accept the shaft 34 of the retention bolt 30 in frictional engagement. The retention lock sides 23 are tapered to correspond to the taper-angle of the mounting bores 44 of the heat sink base 42.

The retention lock 20 comprises a material having the property of high frictional coefficient and moderate compliance. Suitable materials include, but are not limited to, thermoset rubber, silicones, the familiy of materials known as thermoplastic elastomer, and Urethane with an 80–90 shore A hardness. As will be discussed below, it is, in part, the high frictional coefficient of the material that couples the assembly together under static and dynamic loading conditions.

The two ends 22 of retention lock 20 in FIGS. 3A and 3B are provided as a convenience during assembly in that, as will be shown below, only one end 22 is used in application.

Figure 4A:
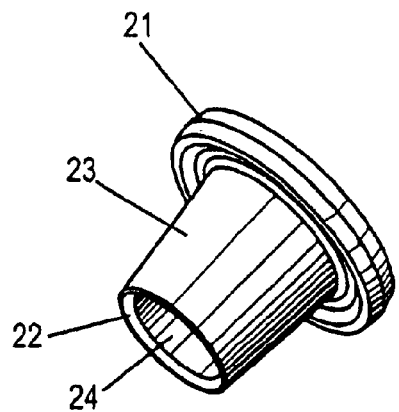
FIGS. 4A and 4B are perspective and cross-sectional views of a retention lock in accordance with another embodiment of the present invention.
Figure 4B:
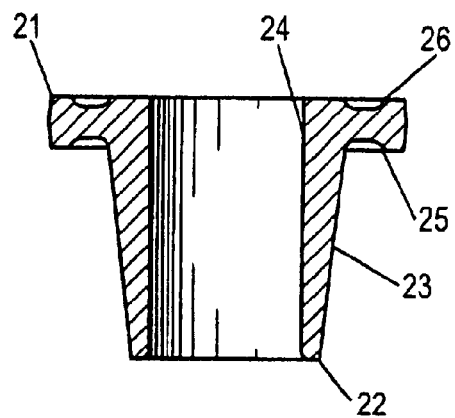

FIGS. 4A and 4B are perspective and cross-sectional views of a retention lock 21 in accordance with another embodiment of the present invention. The retention lock 21 comprises a retention lock bore 24 and one end 22 extending from a retention lock flange 26. The retention lock side 23 of the end 22 tapers inward away from the retention lock flange 26. Other than for the retention lock 20 of FIGS. 3A and 3B having two ends 22, the two embodiments share similar elements.

Referring again to FIG. 2, the heat sink 40 comprises a heat sink base 42 having a microelectronic package-facing side 43 and a heat dissipation side 46. The heat dissipation side 46 is provided with a plurality of heat dissipation members 47, in the form of, for example, but not limited to, pins and fins.

The heat sink base 42 is provided with heat sink mounting bores 44 adapted to accept one end 22 of the retention lock 20, 21. The heat sink mounting bores 44 have mounting bore sides 45 that inwardly taper the farther away from the heat dissipation side 46. The retention lock sides 23 are tapered to correspond to the taper of the mounting bores 44 of the heat sink base 42.

Figure 5:
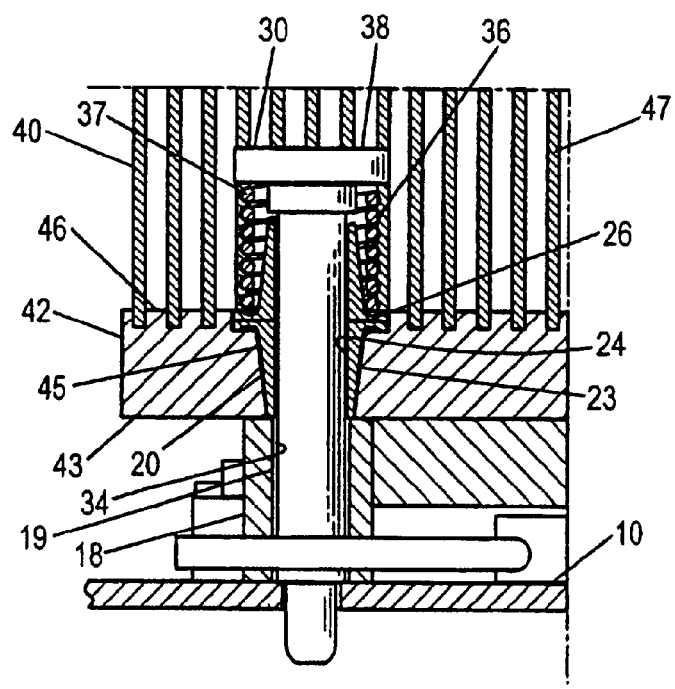
FIG. 5 is a cross-sectional view of the retention system after advancing into and engaging with retention bolts into the socket bores, in accordance with an embodiment of the present invention.

FIG. 5 is a cross-sectional view of the heat sink attachment components after advancing the retention bolts 30 into and engaging with the socket bores 19, in accordance with an embodiment of the present invention. The coil spring 36 is captured between the head 38 of the retention bolt 30 and the retention lock flange 26 of the retention lock 20. A portion of each retention bolt shaft 34 is retained and in frictional engagement with the socket bores 19 of the mounting socket 18. A moderate interference fit between the retention lock 20 and the retention bolt 30 prevents unintended decoupling.

While engaged, the compressed coil spring 36 urges against the retention lock flange 26, with the retention lock flange 26 in urging engagement with the heat dissipation side 46 of the heat sink base 42, with the heat sink base 42 in urging engagement with the thermal interface material on the top 16 of the microelectronic package 14.

The urging engagement of the coil springs 36 provide a constant bias for urging engagement between the components. This constant bias provides that the retention lock 20 will remain in urging engagement with the heat sink base 42 in the event of dimensional change within the thermal interface material or other components. This permits the use of phase change thermal interface material that can be heated and caused to soften, and thus change dimension, to effect a more intimate thermal connection between microelectronic package-facing side 43 of the heat sink base 42 and the top 16 of the microelectronic package 14.

The interaction between the tapered retention lock sides 23 and the inwardly-tapered mounting bores sides 45 provide added frictional engagement between the retention lock bore 24 and the shaft 34 of the retention bolt 30 during mechanical impact loading in the direction normal (z-direction) to the microelectronic package top 16. During the impact loading condition, the heat sink base 42 will tend to raise with respect to the mounting socket 18. As the heat sink base 42 begins to raise, the inwardly-tapered mounting bore sides 45 will urge against the tapered retention lock sides 23 compressing the retention lock bore 24 resulting in stronger urging engagement with the retention bolt shaft 34, preventing the heat sink base 42 from moving out of engagement with the thermal interface material on the microelectronic package top 16.

Figure 6:
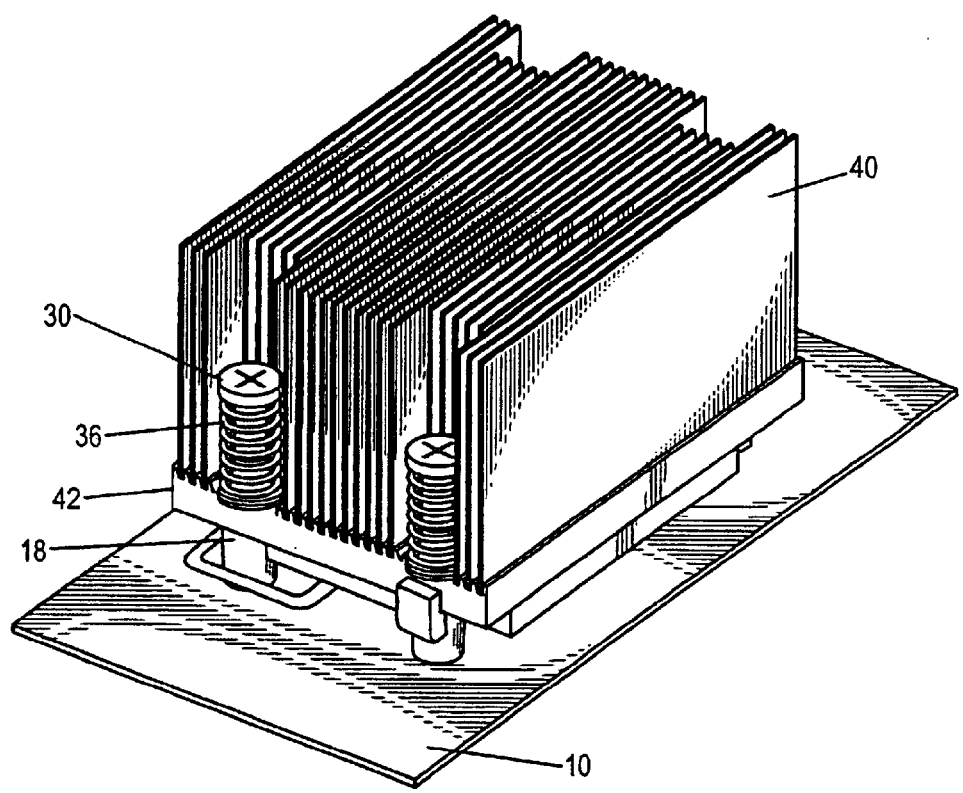
FIG. 6 is a perspective view of the heat sink attachment of FIG. 1.

FIG. 6 is a perspective view of the heat sink attachment components with the retention bolts 30 engaged with the retention locks 20 (hidden), heat sink 40, and mounting sockets 18, in accordance with the present invention. As assembled, the retention locks (hidden) will ensure that the heat sink 40 remains in thermal and mechanical engagement with the microelectronic package (hidden) in both static and dynamic loading conditions.

In mathemamtical simulation, the movement of the heat sink 40 away from the microelectronic package 14 during an upward impact or shock of 50 G acceleration to the heat sink, was limited to no more than 0.004 inch in accordance with an embodiment of the present invention. At impact, as the heat sink 40 begins to move away from the microelectronic package 14, the tapered mounting bore sides 45 compress the tapered retention lock sides 23 around the shaft 34 of the retention bolt 30 and limits any movement. This limited movement prevents decoupling of the heat sink 40 from the microelectronic package 14. This movement compares advantageously with the more than 0.060 inch movement experienced with commonly used retention devices.

The heat sink 40 stays in contact with the microelectronic package 14 instead of traveling and upon return impacting the microelectronic package top 16. In addition, the heat sink 40 is allowed to advance forward upon dimensional changes in the thermal interface material.

The components are disassembled by rotating the retention bolt 30, which releases the retention lock 20 from the heat sink 40. During removal, upon rotation of the retention bolt 30, the torque forces overcome the frictional forces and allow the retention lock 20 to release the retention bolt shaft 34 and therefore permits removal of the heat sink 40.

It is anticipated that the retention system provided in accordance with the present invention can be used to advantage in other applications for any component that needs to take up tolerance, maintain intimate contact, and survive an impact/shock, and should not be limited by the examples provided above.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A retention system, comprising:
   a retention bolt having a shaft and a head defining a flange;
   a coil spring adapted to accept the shaft and be retained by the flange;
   a first component having an inward tapered mounting bore;
   a retention lock having a lock bore adapted to accept the shaft in frictional engagement, the retention lock having an annular outer surface defined by a lock flange and an inward tapered surface therefrom adapted for frictional engagement with the mounting bore, the lock flange having a diameter adapted for abutment by the coil spring and larger than the mounting bore; and
   a socket mount having a socket bore adapted for frictional engagement with the shaft, the shaft adapted to extend serially through the coil spring, through the retention lock flange, through the mounting bore, and in the socket bore, the retention lock inward tapered surface adapted for urging engagement with the inward tapered mounting bore by the coil spring.

2. The retention system of claim 1, further comprising a heat-producing component, wherein the first component is a heat sink comprising a heat sink base having a component-facing side and an opposite side, the component-facing side adapted for thermal coupling with the heat producing component, the inward tapered mounting bore extending from the opposite side to the component-facing side, the socket mount further comprising a heat-producing component socket adapted to accept the heat-producing component, the heat sink component-facing side adapted to be thermally coupled and in biased engagement with the heat-producing component.

3. The retention system of claim 2, wherein the retention lock comprises a material having a compliance and coefficient of friction adapted to provide frictional engagement with the mounting bore sufficient to prevent thermal decoupling between the component-facing side and the heat producing component when subjected to mechanical shock in the direction tending to separate the component-facing side from the heat producing component.

4. The retention system of claim 2, wherein the bias of the coil spring is adapted for advancement of the retention lock and the heat sink into continual abutment with the heat-producing component.

5. The retention system of claim 2, wherein the annular outer surface of the retention lock is further defined by the lock flange and a second inward tapered surface extending therefrom opposite to the first inward tapered surface, the second inward tapered surface adapted for frictional engagement with the mounting bore.

6. The retention system of claim 2, further comprising a system substrate, wherein the socket mount is coupled to the system substrate.

7. The retention system of claim 1, further comprising:
   a heat-producing component; and
   a system substrate, wherein the first component is a heat sink comprising a heat sink base having a component-facing side and an opposite side, the component-facing side adapted for thermal coupling with the heat producing component, the inward tapered mounting bore extending from the opposite side to the component-facing side, the heat-producing component coupled to the system substrate, the socket mount coupled to the system substrate adjacent to or surrounding the heat-producing component.

8. An electronic system, comprising:
   a system substrate;
   a heat-producing component coupled to a first side of the system substrate;
   a heat sink mount coupled to the system substrate and positioned adjacent to or surrounding the heat-producing component, the heat sink mount comprising one or more socket mounts;
   one retention bolt associated with each socket mount, each retention bolt having a shaft and a head defining a flange;
   one coil spring associated with each retention bolt, each coil spring adapted to accept the shaft and be retained by the flange;
   a heat dissipation device having one or more inward tapered mounting bores; and
   a retention lock associated with each retention bolt, each retention lock having a lock bore adapted to accept the shaft in frictional engagement, the retention lock having an annular outer surface defined by a lock flange and an inward tapered surface therefrom adapted for frictional engagement with the mounting bore, the lock flange having a diameter adapted for abutment by the coil spring and larger than the mounting bore, wherein
   each socket mount having a socket bore adapted for frictional engagement with the shaft, the shaft adapted to extend serially through the coil spring, through the retention lock flange, through the mounting bore, and in the socket bore, the retention lock inward tapered surface adapted for urging engagement with the inward tapered mounting bore by the coil spring.

9. The retention system of claim 8, wherein the heat dissipation device is a heat sink comprising a heat sink base having a component-facing side and an opposite side, the component-facing side adapted for thermal coupling with the heat producing component, the inward tapered mounting bore extending from the opposite side to the component-facing side, the socket mount further comprising a heat-producing component socket adapted to accept the heat-producing component.

10. The retention system of claim 9, wherein the retention lock comprises a material having a compliance and coefficient of friction adapted to provide frictional engagement with the mounting bore sufficient to resist thermal decoupling between the component-facing side and the heat producing component when subjected to mechanical shock in the direction tending to separate the component-facing side from the heat producing component.

11. The retention system of claim 10, wherein the bias of the coil spring is adapted for advancement of the retention lock and the heat sink into continual abutment with the heat-producing component.

12. A computer assembly, comprising:

an enclosure;

a system substrate mounted in the enclosure;

a microelectronic package coupled to a first side of the system substrate;

a heat sink mount coupled to the system substrate and positioned adjacent to or surrounding the microelectronic package, the heat sink mount comprising one or more socket mounts;

one retention bolt associated with each socket mount, each retention bolt having a shaft and a head defining a flange;

one coil spring associated with each retention bolt, each coil spring adapted to accept the shaft and be retained by the flange;

a heat dissipation device having one or more inward tapered mounting bores; and a retention lock associated with each retention lock, each retention lock having a lock bore adapted to accept the shaft in frictional engagement, the retention lock having an annular outer surface defined by a lock flange and an inward tapered surface therefrom adapted for frictional engagement with the mounting bore, the lock flange having a diameter adapted for abutment by the coil spring and larger than the mounting bore, wherein each socket mount having a socket bore adapted for frictional engagement with the shaft, the shaft adapted to extend serially through the coil spring, through the retention lock flange, through the mounting bore, and in the socket bore, the retention lock inward tapered surface adapted for urging engagement with the inward tapered mounting bore by the coil spring.

13. The system of claim 12, wherein the heat dissipation device is a heat sink comprising a heat sink base having a package-facing side and an opposite side, the package-facing side adapted for thermal coupling with the microelectronic package, the one or more inward tapered mounting bores extending from the opposite side to the package-facing side, the socket mount further comprising a microelectronic package socket adapted to accept the microelectronic package.

14. The system of claim 13, wherein the retention lock comprises a material having a compliance and coefficient of friction adapted to provide frictional engagement with the mounting bore sufficient to resist thermal decoupling between the package-facing side and the microelectronic package when subjected to mechanical shock in the direction tending to separate the package-facing side from the microelectronic package.

15. The system of claim 14, wherein the bias of the coil spring is adapted for advancement of the retention lock and the heat sink into continual abutment with the microelectronic package.

* * * * *

UNITED STATES PATENT AND TRADEMARK OFFICE
CERTIFICATE OF CORRECTION

PATENT NO. : 6,859,367 B2  Page 1 of 1
APPLICATION NO. : 10/336628
DATED : February 22, 2005
INVENTOR(S) : Peter A. Davison It is certified that error appears in the above-identified patent and that said Letters Patent is hereby corrected as shown below:

Column 6
Line 47, "The retention system of..." should read --The electronic system of...--.
Line 56, "The retention system of..." should read --The electronic system of...--.
Line 64, "The retention system of..." should read --The electronic system of...--.

Column 7
Line 19, "...each retention lock,..." should read --...each retention bolt,...--.

Column 8
Line 6, "The system of..." should read --The computer assembly of...--.
Line 16, "The system of..." should read --The computer assembly of...--.
Line 24, "The system of..." should read --The computer assembly of...--.

Signed and Sealed this

Tenth Day of April, 2007

JON W. DUDAS
*Director of the United States Patent and Trademark Office*